US012768890B2

(12) United States Patent
Joyce

(10) Patent No.: US 12,768,890 B2
(45) Date of Patent: Oct. 20, 2026

(54) GENERATOR CONTROL RELAY CONTINUOUS BUILT-IN TEST CIRCUIT

(71) Applicant: Hamilton Sundstrand Corporation, Charlotte, NC (US)

(72) Inventor: Thomas P. Joyce, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 176 days.

(21) Appl. No.: 18/797,092

(22) Filed: Aug. 7, 2024

(65) Prior Publication Data

US 2026/0043850 A1 Feb. 12, 2026

(51) Int. Cl.
*G01R 31/327* (2006.01)
*H03K 3/037* (2006.01)

(52) U.S. Cl.
CPC ......... *G01R 31/3278* (2013.01); *H03K 3/037* (2013.01)

(58) Field of Classification Search
CPC ................................................. G01R 31/3278
See application file for complete search history.

(56) References Cited

U.S. PATENT DOCUMENTS 5,805,394 A 9/1998 Glennon
6,188,203 B1 2/2001 Rice et al.
7,738,230 B2 6/2010 Mallon et al.
11,705,719 B1 7/2023 Munshi et al.
2003/0009302 A1* 1/2003 Leslie ................ G01R 31/3278 702/65
2013/0182354 A1 7/2013 Maddali et al.
2014/0300481 A1* 10/2014 Overton ............... G08B 21/185 361/187
2015/0146333 A1* 5/2015 Wu ...................... H01H 47/002 361/93.1

FOREIGN PATENT DOCUMENTS

CN 117220253 A 12/2023
CN 113809720 B 3/2024

* cited by examiner

*Primary Examiner* — Tung X Nguyen

(57) ABSTRACT

An apparatus may include a controller configured to periodically generate a control signal at a first logic level to initiate a continuous built-in test for a generator control relay (GCR) switch. The apparatus may also include a GCR switch control circuit configured to determine when the GCR switch will not have a current flowing therethrough and generate a GCR switch control signal to open the GCR switch responsive to the control signal. The apparatus may further include a voltage monitoring circuit configured to monitor a voltage across the GCR switch when the GCR switch is opened and compare the monitored voltage to a threshold value. The voltage monitoring circuit is also configured to generate a first output value indicating the GCR switch has passed the continuous built-in test or a second output value indicating the GCR switch has failed the continuous built-in test.

20 Claims, 4 Drawing Sheets

GENERATOR CONTROL RELAY CONTINUOUS BUILT-IN TEST CIRCUIT

TECHNICAL FIELD

This disclosure relates generally to generator control relays. More specifically, this disclosure relates to a continuous built-in test circuit for a generator control relay.

BACKGROUND

Within aerospace electrical power generation systems (EPGSs), generator control units (GCUs) include generator control relay (GCR) circuits that act as a redundant mechanism to excite a generator of the GCU to prevent and/or avoid fault conditions from occurring. In most variable frequency systems and some constant frequency systems, an excitor drive for a generator may be implemented as a two-switch drive. In these cases, the GCR circuitry may be implemented not as an actual relay but as an electronic switch that may be in series with one of the excitor drive control switches. The electronic switch may be useful in aerospace electrical power generation systems because it ensures that there may be a redundant way to protect a generating channel from overvoltage conditions or other fault conditions if there may be a single failure in the GCU causing potential over-excitation of the generator. Thus, verifying the integrity of the operation of the GCR circuitry can be useful or important to aerospace electrical power generation systems. However, verifying that the GCR circuitry can protect the generating channel while the generating channel may be currently online may be difficult because the GCR circuitry has excitor current flowing through the circuit in the steady state condition to allow the GCU to regulate the generator's output voltage.

SUMMARY

This disclosure relates to a continuous built-in testing for generator control relay switches.

In some examples, an apparatus for performing a continuous built-in test for a generator control relay (GCR) switch. The apparatus also may include a controller configured to periodically generate a continuous built-in test (CBIT) control signal at a first logic level to initiate the CBIT for the GCR switch. The apparatus also may include a GCR switch control circuit configured to determine when to open the GCR switch and to generate a GCR switch control signal to open the GCR switch. The apparatus also may include a voltage monitoring circuit configured to monitor a voltage across the GCR switch when the GCR switch may be opened, compare the monitored voltage to a threshold value, generate a first output value indicating the GCR switch has passed the continuous built-in test responsive to a first comparison result or a second output value indicating the GCR switch has failed the continuous built-in test responsive to a second comparison result.

Any single one or any combination of the following features may be used with the examples above. The apparatus where the GCR switch control circuit may be configured to determine when the GCR switch will not have the current flowing therethrough and to generate the GCR switch control signal to open the GCR switch responsive to (i) the CBIT control signal from the controller, (ii) an exciter drive control signal from a generator control circuit, and (iii) a GCR control signal that drives the GCR switch when the GCR switch control circuit may be disabled. The GCR switch control circuit may include a latch circuit configured to latch a test completion status signal to one of a first logic state indicating a test may be incomplete and a second logic state indicating the test may be incomplete, where the latch may be cleared responsive to the CBIT control signal from the controller going to a second logic level. The voltage monitoring circuit may include a voltage sensing circuit configured to sense the voltage across the open GCR switch and to generate a voltage sense signal and a comparator configured to compare the voltage sense signal with a reference voltage and generate a first logic signal to indicate the GCR switch has passed the continuous built-in test or a second logic signal to indicate the GCR switch has failed the continuous built-in test. The voltage monitoring circuit may include a latch circuit configured to latch an output to the first output value responsive to a determination that the GCR switch has passed the continuous built-in test or latch the output to the second output value indicating the GCR switch has failed the continuous built-in test. The determination of when to open the GCR switch is based on (i) a state of the CBIT control signal from the controller and (ii) a determination of when the GCR switch will not have a current flowing therethrough. The GCR switch control circuit may be further configured to open the GCR switch for a single off switch cycle when an exciter switch associated with the GCR switch may be also open.

In other examples, an apparatus for performing a continuous built-in test for a generator control relay (GCR) switch. The apparatus also may include a controller configured to periodically generate a continuous built-in test (CBIT) control signal at a first logic level to initiate the CBIT test for the GCR switch. The apparatus also may include a GCR switch control circuit configured to generate a GCR switch control signal to open the GCR switch responsive to (i) the CBIT control signal from the controller, (ii) an exciter drive control signal from a generator control circuit, (iii) a GCR control signal that can open the GCR switch, and (iv) a CBIT completion status signal which disables the GCR switch control circuit from opening the GCR switch after it has already opened one time for a given test iteration. The apparatus also may include a first latch circuit configured to latch a test completion status signal to one of a first logic state indicating a test may be incomplete and a second logic state indicating the test may be incomplete, where the first latch may be cleared responsive to the CBIT control signal from the controller going to a second logic level. The apparatus also may include a voltage sensing circuit configured to sense a voltage across the open GCR switch and to generate a voltage sense signal. The apparatus also may include a comparator configured to compare the voltage sense signal with a reference voltage and generate a first logic signal to indicate the GCR switch has passed the continuous built-in test or a second logic signal to indicate the GCR switch has failed the continuous built-in test. The apparatus also may include a second latch circuit configured to latch an output to the first logic signal responsive to the first logic signal from the comparator or latch the output to the second logic signal responsive to the second logic signal from the comparator.

Any single one or any combination of the following features may be used with the examples above. The apparatus where the GCR switch control circuit may be configured to be disabled by the controller. The second latch circuit may be cleared responsive to the CBIT control signal from the controller going to a second logic level. The GCR switch control circuit may be further configured to open the GCR switch for a single off switch cycle when an exciter switch associated with the GCR switch may be also open. The GCR switch control circuit may include a NAND gate having a first input connected to receive the CBIT control signal from the controller, a second input connected to receive the exciter drive control signal from the generator control circuit, and a third input connected to receive a CBIT completion status signal, an AND gate having a first input connected to an output of the NAND gate, a second input connected to receive the GCR control signal, and an output configured to provide the GCR control signal to open and close the GCR switch and a third latch circuit configured to generate the CBIT completion status signal responsive to the output of the NAND gate. The third latch circuit may be configured to enable and disable the NAND gate responsive to the CBIT completion status signal. The apparatus may include a GCR drive and isolation circuit configured to drive the GCR switch responsive to the GCR control signal.

In still other examples, a method for performing a continuous built-in test for a generator control relay (GCR) switch. The method also may include periodically generating a control signal at a first logic level to initiate the continuous built-in test for the GCR switch using a controller. The method also may include determining when the GCR switch will not have a current flowing therethrough using a GCR switch control circuit. The method also may include generating a GCR switch control signal to open the GCR switch responsive to the control signal from the controller using a GCR switch control circuit when the GCR switch does not have the current flowing therethrough. The method also may include monitoring a voltage across the GCR switch when the GCR switch may be opened using a voltage monitoring circuit. The method also may include comparing the monitored voltage to a threshold value using the voltage monitoring circuit. The method also may include generating a first output value indicating the GCR switch has passed the continuous built-in test responsive to a first comparison result or a second output value indicating the GCR switch has failed the continuous built-in test responsive to a second comparison result.

The method where generating the GCR switch control signal may include: determining when the GCR switch will not have the current flowing therethrough using the GCR switch control circuit; and generating the GCR switch control signal to open the GCR switch responsive to (i) the control signal from the controller, (ii) an exciter drive control signal from a generator control circuit, and (iii) a GCR control signal that drives the GCR switch when the GCR switch control circuit may be disabled. The method may include disabling the GCR switch control circuit using the controller. The method may include latching an output of the voltage monitoring circuit to the first output value using a latch responsive to a determination that the GCR switch has passed the continuous built-in test or to the second output value responsive to a determination that the GCR switch has failed the continuous built-in test. The method may include clearing the latch responsive to the control signal from the controller going to a second logic level. The method may include opening the GCR switch for a single off switch cycle when an exciter switch associated with the GCR switch may be also open.

Other technical features may be readily apparent to one skilled in the art from the following figures, descriptions, and claims.

BRIEF DESCRIPTION OF THE DRAWINGS

For a more complete understanding of this disclosure and its advantages, reference is now made to the following description taken in conjunction with the accompanying drawings, in which like reference numerals represent like parts.

DETAILED DESCRIPTION

FIGS. 1 through 4, described below, and the various embodiments used to describe the principles of the present disclosure are by way of illustration only and should not be construed in any way to limit the scope of this disclosure. Those skilled in the art will understand that the principles of the present disclosure may be implemented in any type of suitably arranged device or system.

As noted above, within aerospace electrical power generation systems (EPGSs), generator control units (GCUs) include generator control relay (GCR) circuits that act as a redundant mechanism to excite a generator of the GCU to prevent and/or avoid fault conditions from occurring. In most variable frequency systems and some constant frequency systems, an excitor drive for a generator may be implemented as a two-switch drive. In these cases, the GCR circuitry may be implemented not as an actual relay but as an electronic switch that may be in series with one of the excitor drive control switches. The electronic switch may be useful in aerospace electrical power generation systems because it ensures that there may be a redundant way to protect a generating channel from overvoltage conditions or other fault conditions if there may be a single failure in the GCU causing potential over-excitation of the generator. Thus, verifying the integrity of the operation of the GCR circuitry can be useful or important to aerospace electrical power generation systems. However, verifying that the GCR circuitry can protect the generating channel while the generating channel may be currently online is difficult because the GCR circuitry has excitor current flowing through the circuit in the steady state condition to allow the GCU to regulate the generator's output voltage.

Existing GCUs may include a one-time check of the GCR's de-excitation functionality prior to bringing a generating channel online. However, existing GCUs do not include continuous built-in testing of the GCR's de-excitation function. Thus, a failure of the GCR device to a shorted mode that occurs after coming online would not be detectable by the system until the generating channel was brought offline and then back online again. In this case, the GCR failure would go undetected, and the GCR would not provide the redundant protection that it was intended to provide. This could impact the safety of the electrical power generation system negatively should the redundant protection be required. This disclosure provides a continuous built-in test circuit for a generator control relay that can resolve these or other issues.

Figure 1:
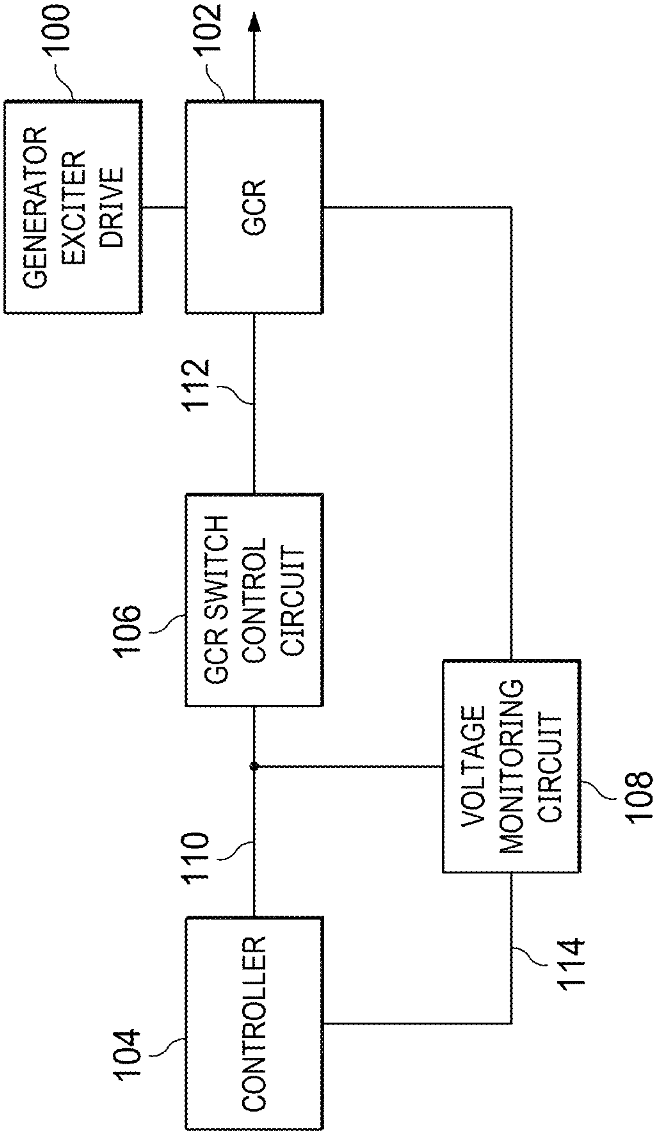
FIG. 1 illustrates an example continuous built-in test circuit for a generator control relay (GCR) switch associated with a generator in accordance with this disclosure.

FIG. 1 illustrates an example continuous built-in test circuit for a generator control relay (GCR) switch 102 associated with a generator exciter drive 100 in accordance with this disclosure. As noted previously, verifying the operation of the GCR switch 102 is difficult while the GCR switch 102 is in operation due to the fact that the GCR switch 102 has excitor current flowing through the device in steady state to enable the GCR switch 102 to regulate the output voltage of the generator associated with the generator exciter drive 100. The GCR switch 102 may be controlled by a controller 104 that is interconnected with the GCR switch 102 via a GCR switch control circuit 106 and a voltage monitoring circuit 108. The controller 104 controls the operation of the GCR switch control circuit 106 while providing a control signal via a line 110 to open the GCR switch 102. The GCR switch control circuit 106 determines whether the right conditions are present to control the GCR switch 102 to open based on: (i) the state of the GCR switch CBIT control signal 110, (ii) whether or not there is a current presently flowing through the GCR switch 102 to the voltage generator exciter drive 100, (iii) a GCR control signal controlled by protection logic that can open the GCR switch 102 irrespective of CBIT logic, and (iv) a CBIT completion status signal which disables the CBIT control circuitry from opening the GCR switch 102 after it has already opened one time for a given test iteration; and, when no current is being provided, provides a control signal to the GCR via line 112 to open the GCR switch 102.

Once the GCR switch 102 is opened, the voltage monitoring circuit 108 measures the voltage across the GCR switch 102. If the measured voltage does not exceed a specified threshold level, a fault condition is indicated by the voltage monitoring circuit 108 to the controller 104 via a control line 114.

Using the control circuit of FIG. 1, the GCR switch 102 may be commanded to open by the GCR switch control circuit 106 only when the excitor switches are also commanded to open and the GCR switch 102 is in the off time of the switching period. In some cases, the GCR switch 102 may be commanded to open by the GCR switch control circuit 106 only for one single switching cycle for each periodic continuous built-in test check. When the GCR switch 102 is opened during the continuous built-in test check routine, a supply voltage (DC link voltage) will develop across the series combination of one excitor control switch and the GCR switch 102. Whichever of these two switches opens fastest can develop the DC link voltage across it instantaneously. Once both switches are open, a capacitive charge transfer may occur, causing the voltage across each switch to change. Also, in some cases, the GCR switch control circuit 106 may control the GCR switch 102 to open for a single switching off-cycle based on a latching hardware circuit within the GCR switch control circuit 106.

The voltage monitoring circuit 108 monitors the voltage across the GCR switch 102. If the voltage monitoring circuit 108 indicates that the GCR voltage increases above a specified threshold value, the output signal via control line 114 can be latched as a pass indication to the controller 104. If the GCR voltage does not increase above the specified threshold voltage, the output signal via control line 114 can be latched as a fail indication to the controller 104.

Figure 2:
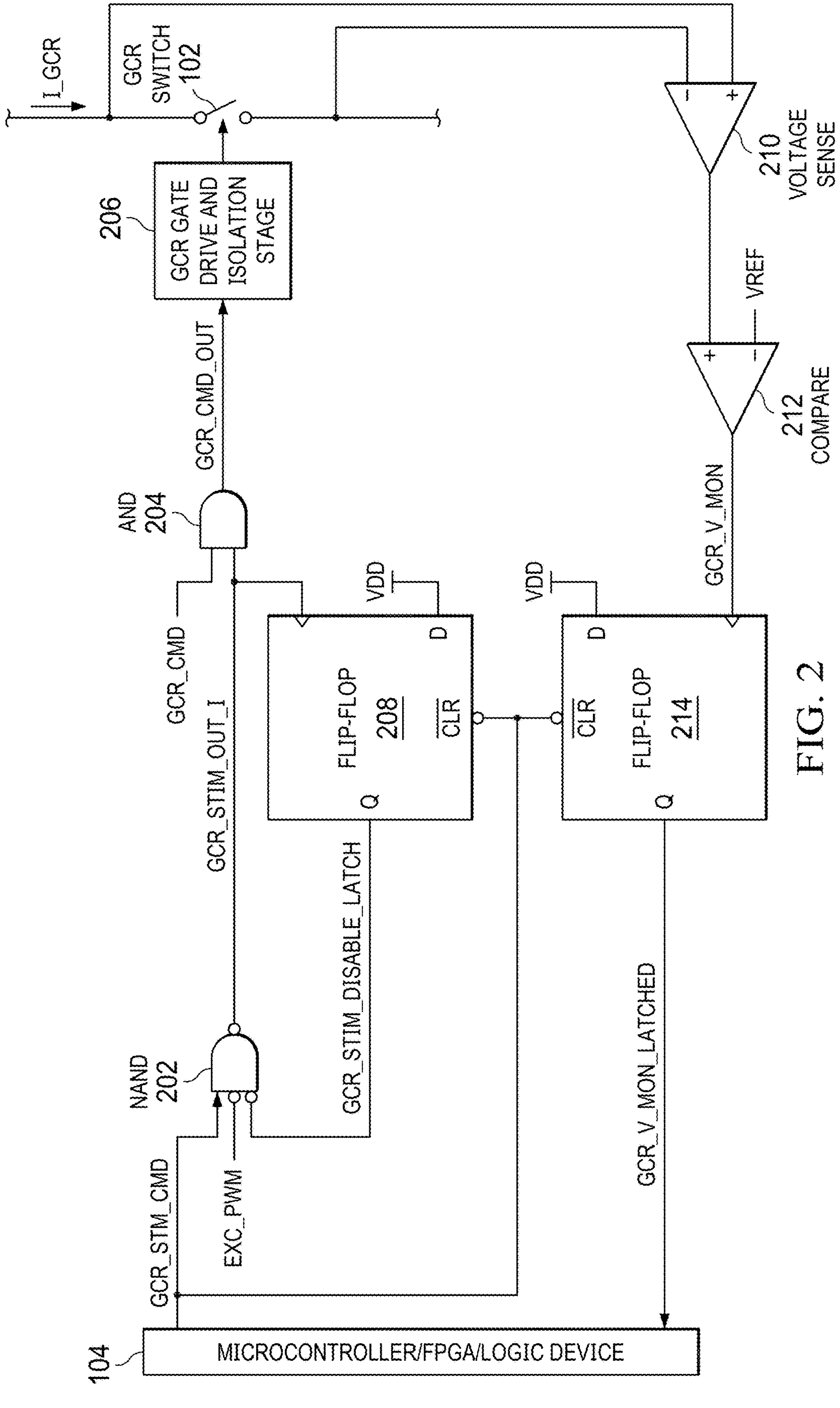
FIG. 2 illustrates an example continuous built-in test circuit for a generator control relay in accordance with this disclosure.

FIG. 2 illustrates an example continuous built-in test circuit for a GCR switch 102 in accordance with this disclosure. More specifically, FIG. 2 illustrates a logic circuit for implementing the system illustrated with respect to FIG. 1 for a continuous built-in test circuit for a GCR switch 102. The controller 104 may include a microcontroller, field programmable gate array (FPGA), application specific integrated circuit (ASIC), or other logic or control device for controlling the operation of the GCR switch control circuit 106 of FIG. 1. As shown in FIG. 2, the GCR switch control circuit 106 may include a NAND gate 202, an AND gate 204, a GCR gate drive and isolation stage 206, and a D flip-flop 208. The voltage monitoring circuit 108 of FIG. 1 may include a voltage sense circuit 210, a comparator 212, and a D flip-flop 214.

The controller 104 can initiate a test process by driving a GCR_STM_CMD signal to the NAND gate 202 to a high logic value (H). An EXC_PWM signal to the NAND gate 202 represents an exciter drive control signal. If the EXC_PWM signal is a high logic value, the exciter drive is active, and the GCR switch 102 remains closed. If the EXC_PWM signal is a low logic value (L), the exciter drive is inactive, and the GCR switch 102 may be closed. A GCR_STIM_DISABLE_LATCH signal from the D flip-flop 208 is used to enable or disable the NAND gate 202 and thus the GCR switch control circuit 106. When the GCR_STM_CMD signal is a high logic value to start the GCR switch test, upon the first falling edge of the EXC_PWM signal, the output (GCR_STIM_OUT_I signal) of the NAND gate 202 goes to a low logic value, and the test of the GCR switch 102 is initiated. The output of the NAND gate 202 goes to the low logic value when the GCR_STIM_DISABLE_LATCH signal is at the low logic value, the EXC_PWM signal is at the low logic value, and the GCR_STM_CMD signal is at the high logic value. Upon the first subsequent rising edge of the EXC_PWM signal, the output (GCR_STIM_OUT_I signal) of the NAND gate 202 goes to a high logic state to complete the test. This rising edge causes the output Q of the D flip-flop 208 to go to a high logic value and disable further sequences of GCR switch testing until the flip-flop is cleared.

The output of the NAND gate 202 can be applied to one input of the AND gate 204 and to the clock input of the D flip-flop 208. The second input of the AND gate 204 can be connected to a GCR_CMD signal, which is the existing control signal, to open and close the GCR switch 102. When the GCR_CMD signal is a low logic value indicating that the GCR switch 102 should be open or the GCR_STIM_OUT_I signal from the output of the NAND gate 202 is a low logic value, the AND gate 204 generates a low logic value at its output to open the GCR switch 102. The output GCR_CMD_ OUT signal of the AND gate 204 can drive the GCR gate drive and isolation stage 206 to open and close the GCR switch 102 as appropriate.

When the GCR switch 102 is open, a voltage across the terminals of the GCR switch 102 can be measured by the voltage sense circuit 210. The sensed voltage at the output of the voltage sense circuit 210 is provided to a first input of the comparator 212 for comparison to a threshold voltage $V_{ref}$ applied to the second input of the comparator 212. If the measured voltage exceeds the threshold voltage, the output (GCR_V_Mon) of the comparator 212 goes to a high logic value and is applied to the clock input of the D flip-flop 214. The rising clock signal on the clock input of the D flip-flop 214 can cause a voltage indicated by VDD to be latched to the Q output of the D flip-flop 214. The latched output signal GCR_V_MON_LATCHED can be provided to the controller 104. Detection of the voltage VDD at the output of the D flip-flop 214 can indicate a passage of the GCR switch 102 that is operating correctly. No detection of the voltage spike VDD can indicate that the GCR switch 102 has failed and has shorted. This is more fully demonstrated with respect to the waveforms in FIGS. 3 and 4 described below. When the control signal GCR_STM_CMD returns to a low logic value after the test has been performed, this signal is provided to the CLR inputs of D flip-flops 208 and 214 to clear their latched outputs and prepare the circuitry for the next test.

Figure 3:
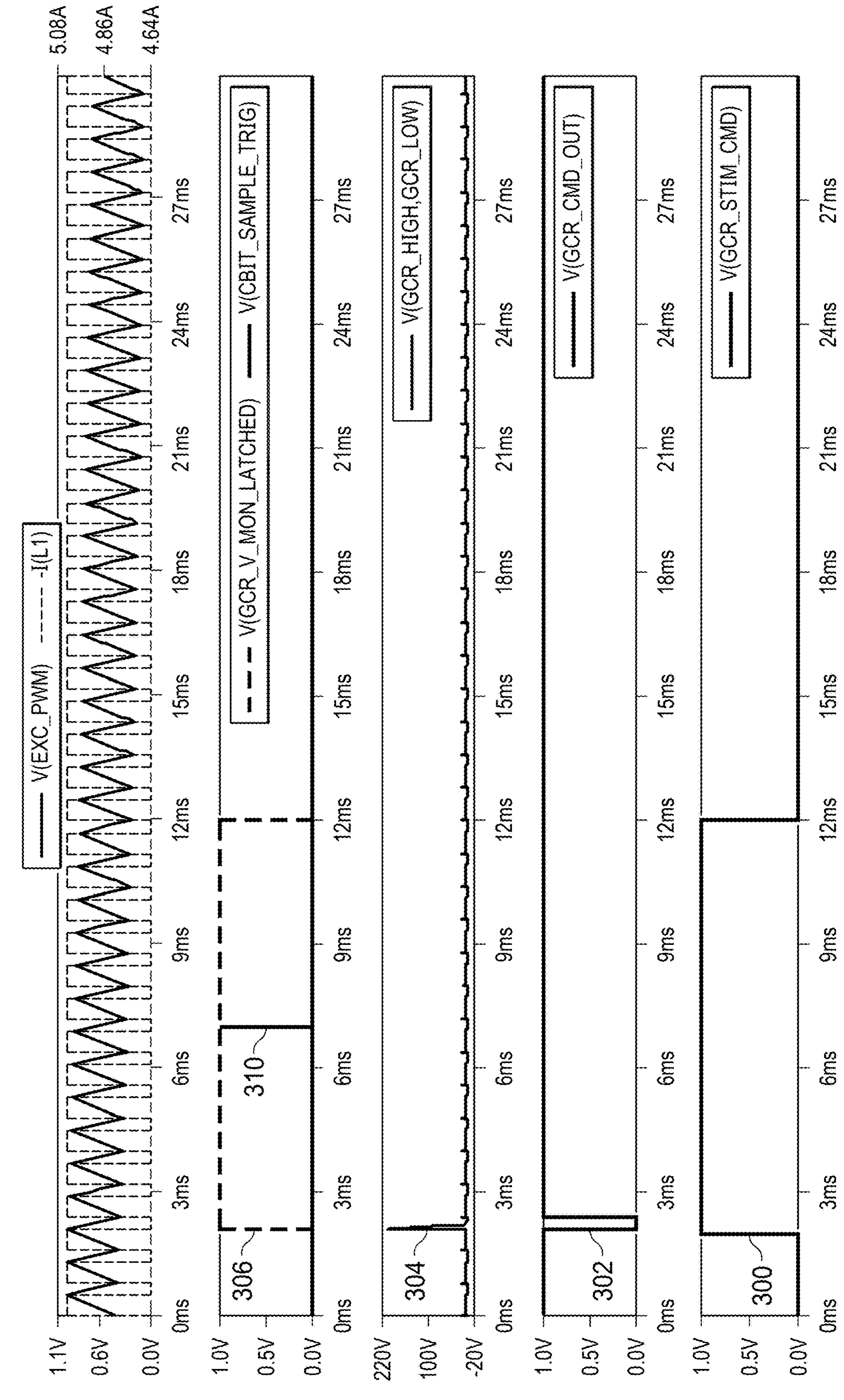
FIG. 3 illustrates example waveforms associated with the continuous built-in test circuit for a generator control relay detecting a passing result in accordance with this disclosure.

FIG. 3 illustrates example waveforms associated with the continuous built-in test circuit for a GCR switch 102 detecting a passing result in accordance with this disclosure. At time T1, an output control signal GCR_STM_CMD 300 from the output of the controller 104 goes from a low logic value to a high logic value. Responsive to this, the output of the AND gate 204 (GCR_CMD_OUT 302) goes from a high logic value to a low logic value. This drives the GCR gate drive and isolation stage 206 to open the GCR switch 102. Opening the GCR switch 102 causes a short voltage pulse (GCR_High minus GCR_Low) 304 to appear across the GCR switch 102. This voltage pulse 304 is detected by the comparator 212, and the output of the comparator GCR_V_MON 312 goes to a high logic value and is latched to an output GCR_V_MON_LATCHED 306 of the D flip-flop 214. GCR_V_MON_LATCHED 306 can remain at a high logic value until the command signal GCR_STM_CMD 300 goes back to a low logic value. While GCR_STM_CMD 300 is logic high, after a delay from the start of the test, the processor can sample GCR_V_MON_LATCHED 306 to determine the pass/fail results of the test at sample time CBIT_SAMPLE_TRIG 310.

Figure 4:
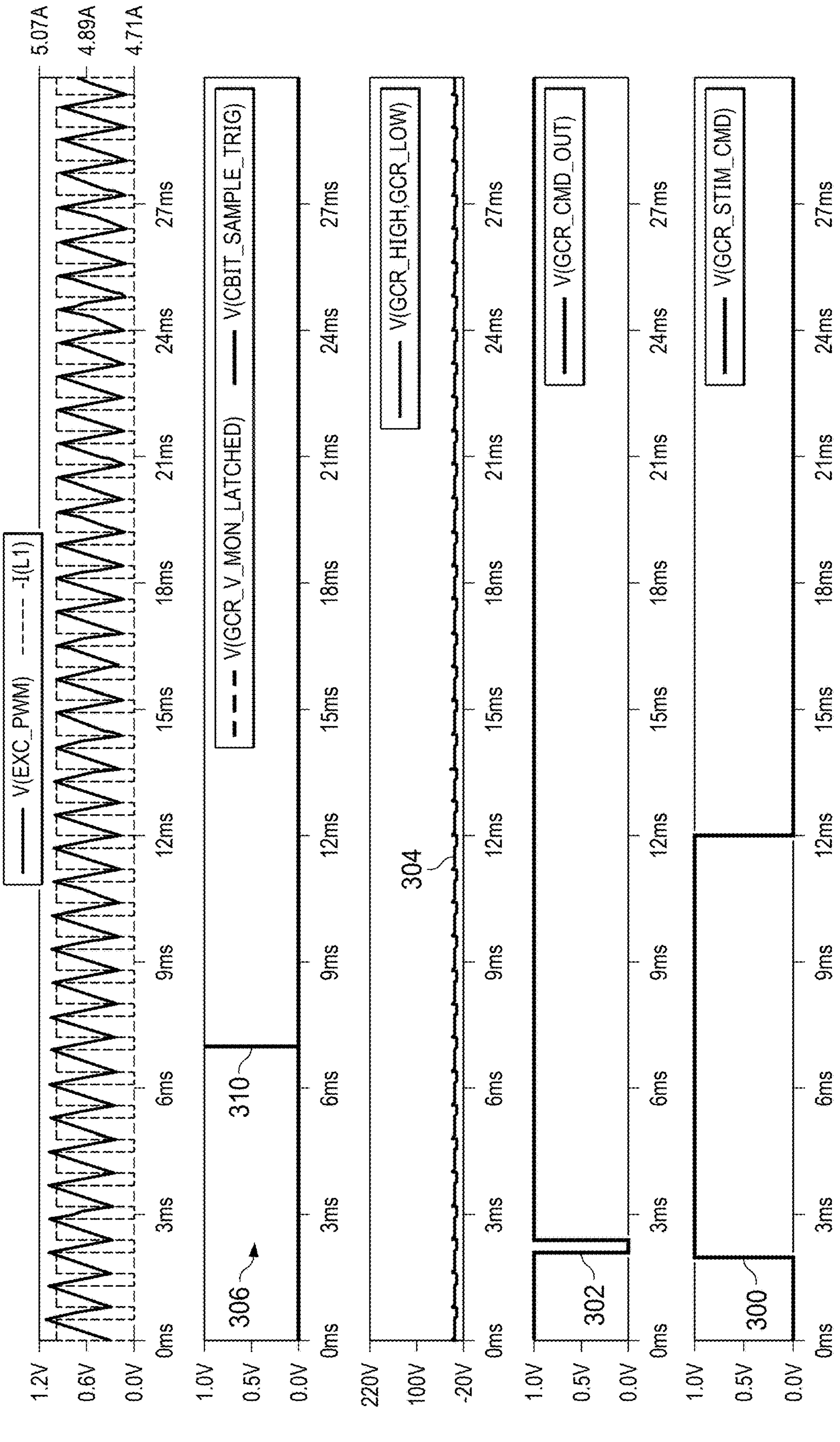
FIG. 4 illustrates example waveforms associated with the continuous built-in test circuit for a generator control relay detecting a failing result in accordance with this disclosure.

FIG. 4 illustrates example waveforms associated with the continuous built-in test circuit for a GCR switch 102 detecting a failing result in accordance with this disclosure. At time T1, the output control signal GCR_STM_CMD 300 from the output of the controller 104 goes from a low logic value to a high logic value. Responsive to this, the output of the AND gate 204 (GCR_CMD_OUT 302) goes from a high logic value to a low logic value. This drives the GCR gate drive and isolation stage 206 to open the GCR switch 102. Opening the GCR switch 102 that has failed in the shorted state causes no voltage pulse (GCR_High minus GCR_LOW) 304 to appear across the GCR switch 102. This low voltage is detected by the comparator 212, and the output of the comparator GCR_V_MON 312 goes to a low logic value. This causes the low logic value to be latched to the output GCR_V_MON_LATCHED 306 of the D flip-flop 214. GCR_V_MON_LATCHED 306 can remain at the low logic value until the command signal GCR_STM_CMD 300 goes back to a low logic value. While GCR_STM_CMD 300 is logic high, after a delay from the start of the test, the processor can sample GCR_V_MON_LATCHED 306 to determine the pass/fail results of the test at sample time CBIT_SAMPLE_TRIG 310.

The continuous built-in test circuit for a GCR switch 102 can provide one or more benefits or advantages depending on the implementation. For example, the continuous built-in test circuit may allow for continuous test coverage of a GCR switch 102 and reduce or eliminate dormant failure modes that might otherwise remain undetected. As a result, this can improve safe operation of the circuitry associated with the GCR switch 102. The continuous built-in test circuit can also provide an algorithm in which the controller 104 only needs to set the command signal GCR_STM_CMD during one software cycle, where the output of the GCR switch 102 may be sampled during a second software cycle and the command signal GCR_STM_CMD may be reset during a third software cycle. In addition, the continuous built-in test circuit may help to ensure that the GCR switch 102 only cycles off a single time during each periodic test check. Thus, the test operation may not impact the control loop or add any appreciable switching losses to the GCR switch 102.

It may be advantageous to set forth definitions of certain words and phrases used throughout this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" may include any of the following combinations: A, B, C, A and B, A and C, B and C, and A and B and C.

The description in the present disclosure should not be read as implying that any particular element, step, or function is an essential or critical element that must be included in the claim scope. The scope of patented subject matter is defined only by the allowed claims. Moreover, none of the claims invokes 35 U.S.C. § 112 (f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim may be understood and intended to refer to structures known to those skilled in the relevant art, as further modified or enhanced by the features of the claims themselves, and is not intended to invoke 35 U.S.C. § 112 (f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus for performing a continuous built-in test for a generator control relay (GCR) switch, the apparatus comprising:

- a controller configured to periodically generate a continuous built-in test (CBIT) control signal at a first logic level to initiate the CBIT for the GCR switch;
- a GCR switch control circuit configured to determine when to open the GCR switch and to generate a GCR switch control signal to open the GCR switch; and
- a voltage monitoring circuit configured to:
  - monitor a voltage across the GCR switch when the GCR switch is opened;
  - compare the monitored voltage to a threshold value; and
  - generate a first output value indicating the GCR switch has passed the continuous built-in test responsive to a first comparison result or a second output value indicating the GCR switch has failed the continuous built-in test responsive to a second comparison result.

2. The apparatus of claim 1, wherein the GCR switch control circuit is configured to determine when the GCR switch will not have a current flowing therethrough and to generate the GCR switch control signal to open the GCR switch responsive to (i) the CBIT control signal from the controller, (ii) an exciter drive control signal from a generator control circuit, and (iii) a GCR control signal that drives the GCR switch when the GCR switch control circuit is disabled.

3. The apparatus of claim 1, wherein the GCR switch control circuit comprises a latch circuit configured to latch a test completion status signal to one of a first logic state indicating a test is incomplete and a second logic state indicating the test is complete, wherein the latch circuit is cleared responsive to the CBIT control signal from the controller going to a second logic level.

4. The apparatus of claim 1, wherein the voltage monitoring circuit comprises:

a voltage sensing circuit configured to sense the voltage across the GCR switch and to generate a voltage sense signal; and a comparator configured to compare the voltage sense signal with a reference voltage and generate a first logic signal to indicate the GCR switch has passed the continuous built-in test or a second logic signal to indicate the GCR switch has failed the continuous built-in test.

5. The apparatus of claim 1, wherein the voltage monitoring circuit comprises a latch circuit configured to latch an output to the first output value responsive to a determination that the GCR switch has passed the continuous built-in test based on a comparison of the voltage across the GCR switch and a reference voltage or latch the output to the second output value indicating the GCR switch has failed the continuous built-in test based on the comparison of the voltage across the GCR switch and the reference voltage.

6. The apparatus of claim 1, wherein the determination of when to open the GCR switch is based on: (i) a state of the CBIT control signal from the controller and (ii) a determination of when the GCR switch will not have a current flowing therethrough.

7. The apparatus of claim 1, wherein the GCR switch control circuit is further configured to open the GCR switch for a single off switch cycle when an exciter switch associated with the GCR switch is also open.

8. An apparatus for performing a continuous built-in test for a generator control relay (GCR) switch, the apparatus comprising:

a controller configured to periodically generate a continuous built-in test (CBIT) control signal at a first logic level to initiate the CBIT for the GCR switch;

a GCR switch control circuit configured to generate a GCR switch control signal to open the GCR switch responsive to (i) the CBIT control signal from the controller, (ii) an exciter drive control signal from a generator control circuit, (iii) a GCR control signal that can open the GCR switch, and (iv) a CBIT completion status signal that disables the GCR switch control circuit from opening the GCR switch after it has already opened one time for a given test iteration;

a first latch circuit configured to latch a test completion status signal to one of a first logic state indicating a test is incomplete and a second logic state indicating the test is complete, wherein the first latch circuit is cleared responsive to the CBIT control signal from the controller going to a second logic level;

a voltage sensing circuit configured to sense a voltage across the GCR switch and to generate a voltage sense signal;

a comparator configured to compare the voltage sense signal with a reference voltage and generate a first logic signal to indicate the GCR switch has passed the continuous built-in test or a second logic signal to indicate the GCR switch has failed the continuous built-in test; and a second latch circuit configured to latch an output to the first logic signal responsive to the first logic signal from the comparator or latch the output to the second logic signal responsive to the second logic signal from the comparator.

9. The apparatus of claim 8, wherein the GCR switch control circuit is configured to be disabled by the controller.

10. The apparatus of claim 8, wherein the second latch circuit is cleared responsive to the CBIT control signal from the controller going to the second logic level.

11. The apparatus of claim 8, wherein the GCR switch control circuit is further configured to open the GCR switch for a single off switch cycle when an exciter switch associated with the GCR switch is also open.

12. The apparatus of claim 8, wherein the GCR switch control circuit comprises:

a NAND gate having a first input connected to receive the CBIT control signal from the controller, a second input connected to receive the exciter drive control signal from the generator control circuit, and a third input connected to receive a CBIT completion status signal;

an AND gate having a first input connected to an output of the NAND gate, a second input connected to receive the GCR control signal, and an output configured to provide the GCR control signal to open and close the GCR switch; and a third latch circuit configured to generate the CBIT completion status signal responsive to the output of the NAND gate.

13. The apparatus of claim 12, wherein the third latch circuit is configured to enable and disable the NAND gate responsive to the CBIT completion status signal.

14. The apparatus of claim 12, further comprising:

a GCR drive and isolation circuit configured to drive the GCR switch responsive to the GCR control signal.

15. A method for performing a continuous built-in test for a generator control relay (GCR) switch, the method comprising:

periodically generating a control signal at a first logic level to initiate the continuous built-in test for the GCR switch using a controller;

determining when the GCR switch will not have a current flowing therethrough using a GCR switch control circuit;

generating a GCR switch control signal to open the GCR switch responsive to the control signal from the controller using a GCR switch control circuit when the GCR switch does not have the current flowing therethrough;

monitoring a voltage across the GCR switch when the GCR switch is opened using a voltage monitoring circuit;

comparing the monitored voltage to a threshold value using the voltage monitoring circuit; and generating a first output value indicating the GCR switch has passed the continuous built-in test responsive to a first comparison result or a second output value indicating the GCR switch has failed the continuous built-in test responsive to a second comparison result.

16. The method of claim 15, wherein generating the GCR switch control signal comprises:

determining when the GCR switch will not have the current flowing therethrough using the GCR switch control circuit; and generating the GCR switch control signal to open the GCR switch responsive to (i) the control signal from the controller, (ii) an exciter drive control signal from a generator control circuit, and (iii) a GCR control signal that drives the GCR switch when the GCR switch control circuit is disabled.

17. The method of claim 15, further comprising:

disabling the GCR switch control circuit using the controller.

18. The method of claim 15, further comprising:

latching an output of the voltage monitoring circuit to the first output value using a latch responsive to a determination that the GCR switch has passed the continuous built-in test based on a comparison of the voltage across the GCR switch and a reference voltage or to the second output value responsive to a determination that the GCR switch has failed the continuous built-in test based on the comparison of the voltage across the GCR switch and the reference voltage.

19. The method of claim 18, further comprising:

clearing the latch responsive to the control signal from the controller going to a second logic level.

20. The method of claim 15, further comprising:

opening the GCR switch for a single off switch cycle when an exciter switch associated with the GCR switch is also open.

* * * * *